United States Patent [19]

Rohde et al.

[11] Patent Number: 5,102,959

[45] Date of Patent: Apr. 7, 1992

[54] AUTO-PHOTOCROSSLINKABLE COPOLYIMIDES AND POLYIMIDE COMPOSITIONS

[75] Inventors: Ottmar Rohde, Basel, Switzerland; Stanley J. Jasne, Peekskill, N.Y.; Josef Pfeifer, Therwil, Switzerland

[73] Assignee: Ciba-Geigy Corporation, Ardsley, N.Y.

[21] Appl. No.: 487,563

[22] Filed: Mar. 2, 1990

Related U.S. Application Data

[60] Division of Ser. No. 281,429, Dec. 8, 1988, Pat. No. 4,925,912, which is a continuation-in-part of Ser. No. 133,407, Dec. 15, 1987, abandoned.

[51] Int. Cl.[5] .................................. C08L 77/06
[52] U.S. Cl. .................................. 525/432; 528/229
[58] Field of Search .................. 525/432; 528/229, 226

[56] References Cited

U.S. PATENT DOCUMENTS

| | | | |
|---|---|---|---|
| 3,533,997 | 10/1970 | Angelo | 525/432 |
| 3,683,047 | 8/1972 | Honda et al. | 525/432 |
| 3,894,114 | 7/1975 | Lohman et al. | 525/432 |
| 4,629,777 | 12/1986 | Pfeifer | 528/353 |
| 4,656,116 | 4/1987 | Rohde et al. | 430/197 |
| 4,657,832 | 4/1987 | Pfeifer | 430/18 |
| 4,680,195 | 7/1987 | Pfeifer | 528/229 |
| 4,698,295 | 10/1987 | Pfeifer et al. | 430/325 |
| 4,778,859 | 10/1988 | Ai et al. | 525/432 |
| 4,786,569 | 11/1988 | Rohde et al. | 430/325 |

FOREIGN PATENT DOCUMENTS 0092524 10/1983 European Pat. Off.

*Primary Examiner*—Marion E. McCamish
*Assistant Examiner*—Christopher D. RoDee
*Attorney, Agent, or Firm*—Harry Falber

[57] ABSTRACT

The present invention relates to copolyimides of 100-70 mol % of recurring structural units of the formula I and 0-30 mol % of recurring structural units of the formula II

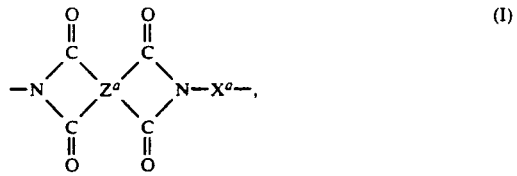

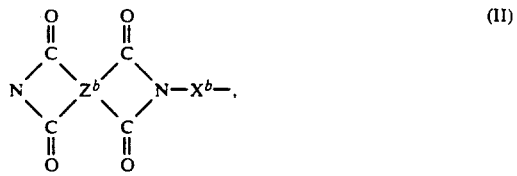

in which $Z^a$ is a tetravalent aromatic tetracarboxylic acid radical other than that of thioxanthonetetracarboxylic acid, the carboxyl groups thereof in each case being located in pairs in the ortho-position or peri-position relative to one another, and $X^a$ is a divalent aromatic diamine radical which, in at least one ortho-position relative to at least one nitrogen atom, carries a hydrocarbon substituent having at least one aliphatic α-hydrogen atom or $X^a$ is a radical of the formula III

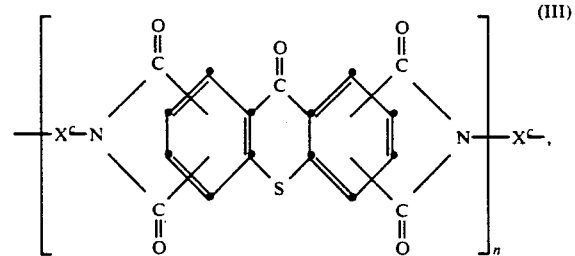

in which $X^c$ is a divalent aromatic diamine radical which, in ortho-position relative to both nitrogen atoms, carries in each case at least one mono-valent hydrocarbon substituent having at least one aliphatic α-hydrogen atom, n assumes an average value of 1.0 to 2.5, $Z^b$ is as defined for $Z^a$ and $X^b$ is an aliphatic, cycloaliphatic, aromatic or araliphatic diamine radical, excluding a radical of the formula III, with the proviso that the proportion of radicals of the formula III in the formula I is selected such that the quantity of thioxanthonetetracarboxylic acid radicals, relative to the total quantity of tetracarboxylic acid units in the copolyimide, is between 1 and 30 mol %. These copolyimides have a high radiation-sensitivity and can be combined with structurally related polyimides to form photocrosslinkable compositions which can be employed for coating purposes.

5 Claims, No Drawings

AUTO-PHOTOCROSSLINKABLE COPOLYIMIDES AND POLYIMIDE COMPOSITIONS

This is a divisional of application Ser. No. 281,429, filed on Dec. 8, 1988, now U.S. Pat. No. 4,925,912, which is a continuation-in-part of Ser. No. 133,407, filed Dec. 15, 1987, now abandoned.

The present invention relates to novel copolyimides, compositions containing these compounds and at least one further polyimide, to a process for producing protective layers or images, and to the use of said compounds or mixtures as photocrosslinkable components in the production of electronic components.

Soluble and at the same time photo-structurable polyimides have been disclosed by EP-A-132,221, -131,752, -162,017 and -181,837.

EP-A-92,524 and -141,781, have disclosed radiation-sensitive coating agents which contain a soluble polyimide and at least one crosslinking agent, for example an organic chromophoric polyazide.

Photo-structurable polyimides are of potential interest as protective layers or interlayers in the production of electronic components. Layers of these materials have a high temperature resistance and are chemically inert, so that they can be used even in process steps where high temperatures and aggressive chemical conditions apply.

Prior auto-photocrosslinkable polyimides contain, in addition to a sensitizer unit incorporated in the polymer chain, for example a radical of benzophenonetetracarboxylic acid or thioxanthonetetracarboxylic acid, diamine radicals having aliphatically bound hydrogen in the α-position or o-position relative to the nitrogen atom, for example o,o-dialkyl-substituted aromatic diamine radicals. As a rule, the photosensitivity increases with the content of incorporated sensitizer. At the desired high photosensitivities, reliance had thus hitherto to be placed on the highest possible sensitizer concentrations, so that the possible variations of other polymer properties, such as thermal stability, glass transition temperature, solubility or water absorption resistance, were restricted.

Likewise, variation of the optical properties of these photo systems, such as light absorption and spectral sensitivity, was only possible to a small extent.

It has now been found that small proportions of thioxanthonetetracarboxylic acid radicals lead, surprisingly, to polyimides of high photosensitivity. This is also of interest for economic reasons, since such systems contain only small proportions of thioxanthonetetracarboxylic acid which is expensive to prepare.

By means of incorporating small quantities of the sensitizer into an inherently non-photoactive material, highly active compounds can thus be prepared without substantially changing the physico-chemical properties of the base polymer.

Moreover, these copolymers can be combined with structurally related, but not necessarily photoactive polyimides to give photoactive materials. The possibilities of variation of highly photosensitive polyimides with respect to material properties, such as thermal stability, glass transition temperature, water absorption, modulus of elasticity, elongation at break and coefficient of thermal expansion, are thus greatly widened. The systems can also be varied in their optical and photochemical behaviour. Thus, for example, the optical absorption can be precisely adjusted to given layer thicknesses and substrates.

The present invention relates to copolyimides comprising 100–70 mol % of recurring structural units of the formula I and 0–30 mol % of recurring structural units of the formula II

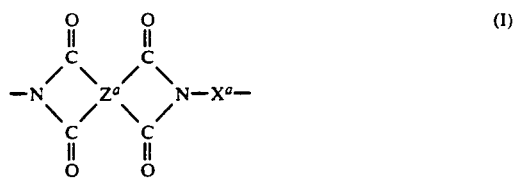

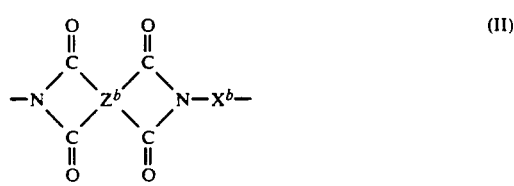

in which $Z^a$ is a tetravalent aromatic tetracarboxylic acid radical other than that of thioxanthonetetracarboxylic acid, the carboxyl groups thereof in each case being located in pairs in the ortho-position or peri-position relative to one another, and $X^a$ is a divalent aromatic diamine radical which, in at least one ortho-position relative to at least one nitrogen atom, carries a hydrocarbon substituent having at least one aliphatic α-hydrogen atom or $X^a$ is a radical of the formula III

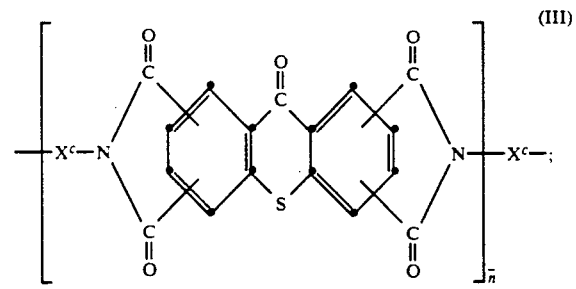

in which $X^c$ is a divalent aromatic diamine radical which, in ortho-position relative to the two nitrogen atoms, carries in each case at least one monovalent hydrocarbon substituent having at least one aliphatic α-hydrogen atom, and $\bar{n}$ assumes an average value of 1.0 to 2.5, $Z^b$ is as defined for $Z^a$ and $X^b$ is an aliphatic, cycloaliphatic, aromatic or araliphatic diamine radical, excluding a radical of the formula III, with the Proviso that the proportion of radicals of the formula III in the formula I is selected such that the quantity of thioxanthonetetracarboxylic acid radicals, relative to the total quantity of tetracarboxylic acid units in the copolyimide, is between 1 and 30 mol %. $Z^a$ and $Z^b$ can be mononuclear or polynuclear, preferably mononuclear or dinuclear, carbocyclic-aromatic or heterocyclic-aromatic radicals, with the exception of thioxanthone radicals. Polynuclear radicals can be fused or, preferably, be linked to one another via a bridge member.

Examples of suitable radicals $Z^a$ and $Z^b$ are to be found in EP-A-181,837, the description of which is also the subject of the present description.

Preferred radicals $Z^a$ and $Z^b$ are of the formulae IV to IX (IV)

(V)

(VI)

(VII)

(VIII)

(IX)

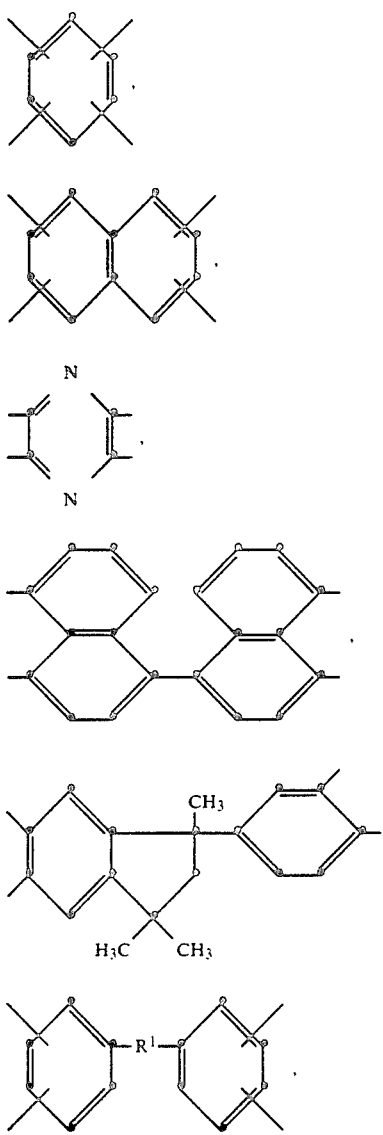

in which the free bonds are in each case located in pairs in the ortho-position relative to one another, $R^1$ is a group of the formulae —CO—, —CH$_2$—, —C(CH$_3$)$_2$—, —C(CF$_3$)$_2$—, —O—, —S—, —SO$_2$—, —NR$^2$—, —SiR$^3$R$^4$—, —SiR$^3$R$^4$—O—SiR$^3$R$^4$— and —O—R$^5$—SiR$^3$R$^4$—O—SiR$^3$R$^4$—R$^5$—O—, $R^2$ is hydrogen or C$_1$–C$_6$alkyl, $R^3$ and $R^4$ independently of one another are C$_1$–C$_6$alkyl, C$_1$–C$_6$perfluoroalkyl, C$_1$–C$_6$alkoxy or C$_1$–C$_6$-perfluoroalkoxy and $R^5$ is alkylene, preferably C$_2$C$_4$alkylene. Preferably, $R^1$ is —CO— or —C(CF$_3$)$_2$—.

Further preferred radicals $Z^a$ and $Z^b$ are of the formula X and XI (X)

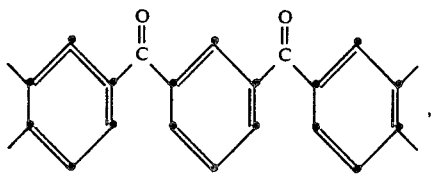

(XI)

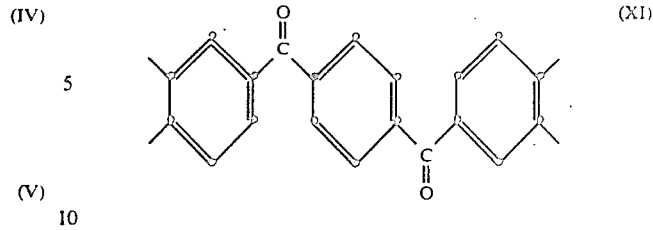

Polyimides containing radicals of this type are known from EP-A-162,017. Further preferred radicals $Z^a$ and $Z^b$ are of the formula XII to XIV.

(XII)

(XIII)

(XIV)

Polyimides containing radicals of this type are known from EP-A-181,837.

The aromatic diamine radical $X^a$ must carry certain substituents and must have a certain substitution pattern.

Thus, in the diamine radical $X^a$ other than that of the formula III, at least one ortho-position relative to a nitrogen atom must be substituted. However several or all four ortho-positions relative to the nitrogen atoms or possible further positions in the aromatic nucleus can also be substituted.

The ortho-substituent can be a monovalent hydrocarbon radical having at least one aliphatic α-hydrogen atom or it can be a divalent hydrocarbon radical which has at least one α-hydrogen atom and, together with the aromatic nucleus, forms a condensed system, for example an alkylene chain.

Further substituents in the ortho-position or in a non-ortho-position can also be of a different nature, for example halogen atoms, such as chlorine. Examples of hydrocarbon substituents having at least one aliphatic α-hydrogen atom are alkyl which may be interrupted in the chain by oxygen atoms or sulfur atoms, cycloalkyl, aralkyl or, in the case of divalent substituents, also alkylene.

Preferred monovalent hydrocarbon substituents are C$_1$–C$_6$alkyl, cyclohexyl or benzyl, very particularly preferred are $C_1$–$C_4$alkyl and especially methyl and ethyl.

Examples of suitable radicals $X^a$ are to be found in EP-A-181,837. The diamine radical $X^a$ other than that of the formula III is, particularly preferably, as defined for the diamine radical $X^c$ in formula III.

$X^c$ is likewise a specifically substituted aromatic diamine radical. The substituents are monovalent hydrocarbon radicals which have at least one aliphatic α-hydrogen atom. However, both nitrogen atoms must have at least one ortho-substituent. These can be radicals $X^c$ which are substituted asymmetrically relative to the ortho-substituents or preferably symmetrically substituted radicals $X^c$. Examples of suitable radicals $X^c$ are to be found in EP-A-181,837.

The aromatic diamine radicals, on which $X^a$ and $X^c$ are based, are in general substituted carbocyclic-aromatic radicals having nuclei of 6 to 22 C atoms. These radicals can be mononuclear or represent polynuclear aromatic systems which are fused or mutually linked via bridge groups. Preferably, they are substituted phenylene radicals or two substituted 1,3- or 1,4-phenylene radicals which are linked via a direct bond or via a bridge group $R^1$ as defined above for radicals of the formula IX.

The structural elements of the formula II are, as appropriate, co-condensed in quantities of up to 30 mol %, preferably up to 20 mol %, relative to the total polymer, into the copolyimide according to the invention, in order to modify properties of the polymer, for example adhesive strength or polarity.

Examples of the diamine component $X^b$ in formula II are to be found in EP-A-181,837.

Examples of aliphatic radicals $X^b$ are $C_2$–$C_{20}$alkylene radicals which may be interrupted in the chain by oxygen atoms or sulfur atoms such as ethylene, tri-, tetra-, penta-, hexa-, hepta-, octa-, nona-, deca-, dodeca-, tetradeca-, hexadeca-, octadeca- or eicosamethylene or di-, tri- or tetra(oxaethylene), -(oxapropylene) or -(oxabutylene).

Aliphatic radicals $X^b$ within the scope of this description are also to be understood as meaning siloxane radicals having aliphatic substituents or siloxane-modified aliphatic radicals.

Amongst the aliphatic radicals $X^b$, radicals containing siloxane groups should be mentioned especially. Examples of these groups are to be found in EP-A-132,221 or in EP-A-54,426.

Examples of cycloaliphatic radicals $X^b$ are 1,2-, 1,3- or 1,4-cyclopentylene or -cyclohexylene.

Examples of aromatic diamine radicals $X^b$ are arylene radicals having 6 to 22C atoms. These radicals can be mononuclear or can be polynuclear aromatic systems which are fused or mutually linked via bridge groups. Preferably they are phenylene radicals, such as 1,3- or 1,4-phenylene, or 1,3- or 1,4-phenylene radicals which are linked via a direct bond or a bridge group —$R^1$— as defined above for radicals of the formula IX, such as 4,4'-diphenylmethane, 4,4'-diphenyl ether or 4,4'-diphenyl sulfone.

They can also be substituted aromatic radicals, for example the groups defined for $X^a$ (with the exception of radicals of the formula III) or $X^c$.

An example of an araliphatic radical $X^b$ is xylylene.

In any $C_1$–$C_6$alkyl, $C_1$–$C_6$alkoxy, $C_1$–$C_6$perfluoroalkyl or $C_1$–$C_6$perfluoroalkoxy radicals, the alkyl radicals or perfluoroalkyl radicals can be straight-chain or branched.

Examples of such radicals are methyl, ethyl, n-propyl, isopropyl, n-butyl, sec-butyl, tert-butyl, n-pentyl, n-hexyl and the corresponding perfluoroalkyl, alkoxy or perfluoroalkoxy groups.

The straight-chain radicals are preferred.

In the thioxanthone radical of the formula III, the carbonyl groups forming the imide system are in each case located in pairs in the ortho-position relative to one another. Those radicals of the formula III are preferred in which the carbonyl groups are in the 3,3',4,4'-position.

The index $\bar{n}$ is preferably an average value (number average) from 1.0 to 1.8, and very particularly from 1.0 to 1.5. The proportion of the thioxanthone radicals, relative to the total quantity of the tetracarboxylic acid units in the copolyimide, is preferably 2.0 to 20 mol %, particularly preferably 3.0 to 15 mol %, and very particularly preferably 5.0 to 15 mol %.

Those copolyimides having the recurring structural units of the formula I and, if appropriate, of the formula II as defined above are preferred in which $Z^a$ and $Z^b$ are radicals of the formulae IV and/or IX.

Those copolyimides having the recurring structural units of the formual I and, if appropriate, of the formula II are very particularly preferred in which $Z^a$ and $Z^b$ are radicals of the formulae IV and/or IX and $R^1$ is —CO—, —O—, —CH$_2$—, —C(CH$_3$)$_2$— and especially —C(CF$_3$)$_2$—.

Those copolyimides consisting of the recurring structural units of the formula I and, if appropriate, the formula II are also preferred in which the proportion of thioxanthone radicals, relative to the total quantity of tetracarboxylic acid units in the copolyimide, is 5.0 to 15 mol %.

Those copolyimides consisting of recurring structural units of the formula I and, if appropriate, of the formula II are very particularly preferred in which $\bar{n}$ assumes an average value of 1.0 to 1.5.

Those copolyimides consisting of recurring structural units of the formula I and, if appropriate, of the formula II are also particularly preferred in which all the radicals $X^a$ other than those of the formula III are divalent radicals of an aromatic diamine which carries in the ortho-position, preferably in both ortho-positions, relative to the two nitrogen atoms in each case at least one monovalent hydrocarbon radical having aliphatic α-hydrogen atoms, preferably a $C_1$–$C_6$alkyl radical, and in which the radicals $X^c$ in formula III are derived from aromatic diamines in which both ortho-positions of both nitrogen atoms each carry monovalent hydrocarbon radicals having aliphatic α-hydrogen atoms, preferably $C_1$–$C_6$alkyl radicals, and in which $X^b$, if present, is in particular a siloxane modified alkylene radical.

Those copolyimides consisting of recurring structural units of the formula I and, if appropriate of the formula II are very particularly preferred in which all the radicals $X^a$, $X^b$ and $X^c$ have the same definition.

Particularly preferred diamine radicals in these preferred embodiments are the groups of the formulae XV to XVIII

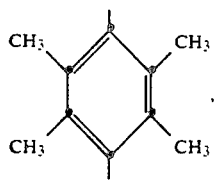
(XV)

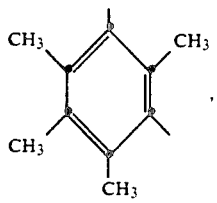
(XVI)

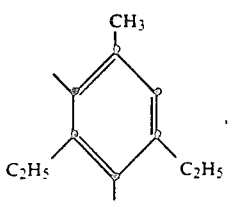
(XVII)

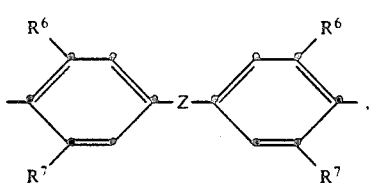
(XVIII)

in which Z is a direct bond or —O—, —CH$_2$— or —C(CF$_3$)$_2$— and R$^6$ and R$^7$ independently of one another are C$_1$-C$_6$alkyl, especially methyl or ethyl.

Radicals of the formula XVIII, in which Z is —CH$_2$— or —C(CF$_3$)$_2$— and R$^6$ and R$^7$ are methyl or ethyl, are very particularly preferred.

Those copolyimides consisting of recurring structural units of the formula I are very particularly preferred in which all the radicals X$^c$ and the radicals X$^a$ other than those of the formula III are derived from aromatic diamines in which both ortho-positions of both nitrogen atoms in each case carry monovalent hydrocarbon radicals having aliphatic α-hydrogen atoms, especially C$_1$-C$_6$alkyl groups, and with very particular preference are groups of the formulae XV to XVIII.

The copolyimides according to the invention have average molecular weights (weight average $\overline{M}_w$) of at least 5,000, preferably at least 10,000. The upper limit depends essentially on properties which determine the processability, for example their solubility. The limit can be up to 500,000, preferably 100,000 and especially up to 60,000. Moreover, these can be random copolyimides or block copolyimides. They are prepared by conventional processes in equipment provided for this purpose.

The copolyimides according to the invention are advantageously prepared by polycondensation of the corresponding tetracarboxylic acids with the corresponding diamines. In place of the tetracarboxylic acids, their polyimide-forming derivatives, for example their dianhydrides, carboxylic acid chlorides, tetraalkyl esters or alkyl half-esters can also be used. Depending on the nature of the diamine radicals X$^a$, X$^b$ and X$^c$, the polycondensation can be carried out in different ways.

If X$^a$, X$^b$ and X$^c$ are each aromatic diamine radicals which carry at least one hydrocarbon substituent having aliphatic α-hydrogen atoms in each ortho-position relative to both nitrogen atoms, the polycondensation can be carried out by directly reacting the tetracarboxylic acids of the formulae XIX, XX and, if appropriate, XXI or their polyimide-forming derivatives, preferably the dianhydrides, with substantially equivalent quantities of one or more diamines of the formulae XXII, XXIII, and, if appropriate, XXIV in a manner known per se

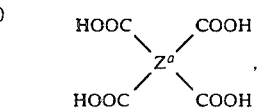
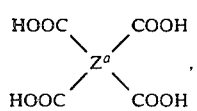 (XIX)

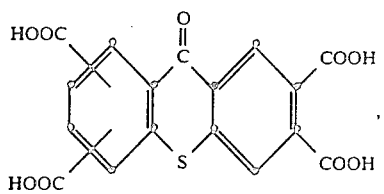 (XX)

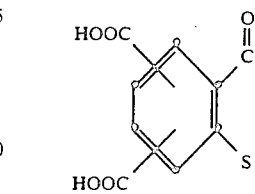
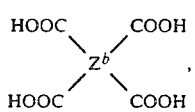 (XXI)

H$_2$N—X$^d$—NH$_2$. (XXII)

H$_2$N—X$^c$—NH$_2$. (XXIII)

H$_2$N—X$^e$—NH$_2$. (XXIV)

in which Z$^a$, Z$^b$ and X$^c$ are as defined above and X$^d$ and X$^e$ can assume one of the meanings defined for X$^c$ (process a). The starting compounds of the formulae XIX to XXIV are known per se and are described, for example, in the abovementioned patent applications relating to auto-photocrosslinkable polyimides.

In this embodiment, the proportion of thioxanthonetetracarboxylic acid is between 1 and 30 mol %, relative to the quantity of the radicals XIX to XXI.

A further preparation process (process b) is suitable for synthesizing the copolyimides obtainable according to process a or of the other copolyimides according to the invention having diamine radicals X$^a$ other than those of the formula III, which do not carry a hydrocarbon substituent having at least one aliphatic α-hydrogen atom in each of the ortho-positions relative to both nitrogen atoms, for example with ortho-monosubstituted aromatic diamine radicals X$^a$ or X$^b$, or with non-aromatic diamine radicals X$^b$. In process b, the polycondensation is carried out in two stages. Initially, a precondensate of the formula XXV is prepared and, if desired, separated into its components which are isolated

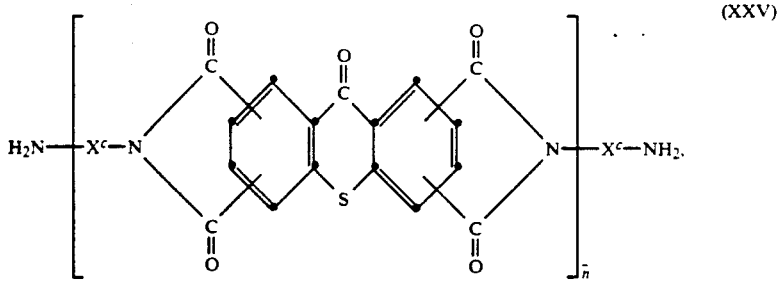

(XXV)

by polycondensating a compound of the formula XX or one of its polyimide-forming derivatives with an excess of a diamine of the formula XXIII in a manner known per se. In this case, the molar ratio of the two components is to be selected such that an average value n of between 1.0 and 2.5 results. These selection criteria are known per se to a person skilled in the art of polycondensation processes.

Advantageously, a molar ratio of tetracarboxylic acid (derivative) to diamine of 1:1.5 to 1:20, preferably from 1:2 to 1:10, is selected. The precondensate of the formula XXV is then polycondensed in a second stage with the remaining tetracarboxylic acid components and, if appropriate, diamine components of the formulae XIX, XXI, XXVI and XXVII in a manner known per se

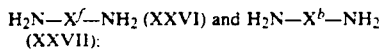

in this case, $X^f$ has one of the meanings defined for $X^a$ with the exception of the formula III and $X^b$ is as defined above.

The quantitative ratios of the components of the formulae XIX and, if appropriate, XXI, XXVI and XXVII in this second stage are advantageously selected such that a virtually equivalent total quantity of the diamines corresponds to the total quantity of the tetracarboxylic acid (derivatives). The quantity of diamine XXV is selected such that the thioxanthone radical content in the copolymer corresponds to the quantity defined above. The starting compounds of the formula XXVI and XXVII are likewise known and are described, for example, in the abovementioned patent applications relating to auto-photocrosslinkable polyimides.

The polycondensations are preferably carried out in solution. The solvents used are polar organic solvents which are inert to the reactants. Examples of these are listed below.

The polycondensations proceed, depending on the reaction temperature, initially up to the polyamide acid intermediate which is then cyclized with elimination of water. The cyclization can take place thermally or it is carried out advantageously under the action of dehydrating agents such as carboxylic acid anhydrides, for example acetic anhydride, or tertiary amines such as triethylamine.

The reaction temperatures are known per se to a person skilled in the art of polycondensations. Preferred reaction temperatures are between −10 ° C. and +20° C.

The copolyimides A) according to the invention can be combined with structurally related, but not necessarily photoactive polyimides B) to give photoactive materials of high radiation sensitivity.

In the case that component B) is a polyimide with a large proportion of benzophenonetetracarboxylic acid radicals, highly radiation-sensitive combinations can also be prepared using a modified component A') which contains a thioxanthonetetracarboxylic acid radical proportion of 20–100 mol %, relative to the total number of tetracarboxylic acid units in component A').

In all these cases, the selection criterion is the total quantity of thioxanthonecarboxylic acid radicals in the mixture, which amounts to 1.0 to 30 mol % relative to all the tetracarboxylic acid radicals in the polyimide mixture. Moreover, the nature of the tetracarboxylic acid components and diamine components in both polyimide components must be such that miscibility of both components in one another is guaranteed.

The invention also relates to compositions essentially containing, as the polyimide components A) a copolyimide or a mixture of copolyimides consisting of 100–70 mol %, in particular 100–80 mol %, of recurring structural units of the formula I and 0–30 mol %, in particular 0–20 mol %, of recurring structural units of the formula II as defined above, the total quantity of thioxanthone radicals in component A), relative to the total quantity of all tetracarboxylic acid radicals in this component, being 2.0 to 40 mol %, or A') a polyimide or a mixture of polyimides consisting of 100–20 mol % of recurring structural units of the formula XXVIII, 0–80 mol % of recurring structural units of the formula XXIX and 0–30 mol %, in particular 0–20 mol %, of recurring structural units of the formula XXX

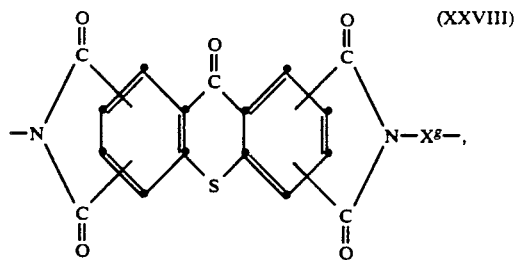

(XXVIII)

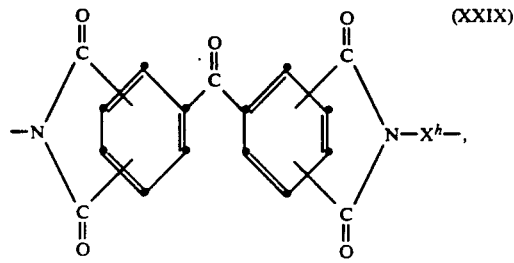

(XXIX)

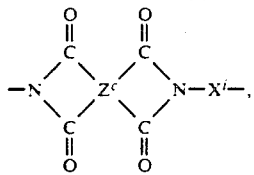

(XXX)

in which $Z^c$ can assume one of the meanings defined for $Z^a$ and $X^g$, $X^h$ and $X^i$ independently of one another can assume one of the meanings defined for $X^c$, and B) a polyimide or a mixture of polyimides consisting of 100–80 mol % of recurring structural units of the formula XXXI and of 0–20 mol % of recurring structural units of the formula XXXII

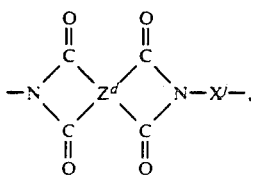

(XXXI)

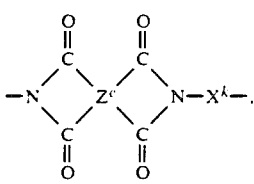

(XXXII)

in which $Z^d$ and $Z^e$ independently of one another can assume one of the meanings defined for $Z^a$, $X^j$ can assume one of the meanings defined for $X^a$ with the exception of the formula III and $X^k$ can assume one of the meanings defined for $X^b$, it being necessary in the case of the A)/B) mixtures that at least 70 mol % of the radicals $Z^d$ and, if appropriate, $Z^e$ in component B), relative to the total quantity of these radicals, are identical to the radicals $Z^a$ and, if appropriate, $Z^b$ in component A) and at least 70 mol % of the radicals $X^j$ and, if appropriate, $X^k$ in component B), relative to the total quantity of these radicals are identical to the radicals $X^a$ other than those of the formula III and, if appropriate, to the radicals $X^b$ in component A), or it being necessary that at least 40 mol %, preferably at least 45 mol %, of the radicals $X^j$ and, if appropriate, $X^k$ in component B), relative to the total quantity of these radicals, are identical to the radicals $X^g$ and, if appropriate, $X^h$ and $X^i$ in component A'), with the proviso that the combination A')/B) is possible in the case where 80–100 mol % of the tetracarboxylic acid radicals of component B) are derived from benzophenonetetracarboxylic acid and that the combinations A)/B) are possible in all other cases, and that in all combinations A)/B) and A')/B) the quantity of the components A) or A') is selected such that the quantity of thioxanthonetetracarboxylic acid radicals, relative to the total quantity of the tetracarboxylic acid radicals in the polyimide mixture, is between 1.0 and 30 mol %, in particular, between 1.0 and 20 mol %.

The thioxanthone radical content in the polyimide of component A) deviates slightly from the above definition of the polyimides according to the invention, since the total thioxanthonetetracarboxylic acid radical content is reduced by the dilution with component B). The polyimides of component A) can be obtained analogously to the processes described above by using the corresponding quantities of the starting compounds XIX to XXVII.

The polyimides of components A') are generally known from EP-A-181,837.

The polyimides of component B) are known per se from EP-A-132,221 and -134,752.

The tetracarboxylic acid radicals $Z^c$, $Z^d$ and $Z^e$ are preferably as defined above for preferred radicals $Z^a$.

With particular preference, these radicals of the formula IV and IX, especially radicals of the formula IX, in which $R^1$ is —CO—, —O—, —CH$_2$— or —C(CF$_3$)$_2$—.

The diamine radicals $X^g$, $X^h$ and $X^i$ preferably assume one of the preferred meanings defined above for $X^c$.

The diamine radical $X^j$ preferably assumes one of the preferred meanings defined above for $X^a$.

The diamine radical $X^k$ preferably assumes one of the preferred meanings defined above for $X^b$.

With very particular preference, $X^g$, $X^h$, $X^i$, $X^j$ and $X^k$ are radicals of the formulae XV to XVIII.

Preferred polyimide compositions of A) and B) or of A') and B) contain a total quantity of thioxanthonetetracarboxylic acid radicals of between 1.0 and 15 mol %, and very particularly between 3.0 and 15 mol %, relative to the total quantity of all tetracarboxylic acid radicals in the polyimide mixture.

Those compositions containing components A) and B) are particularly preferred in which, in component A), the radicals $X^a$ other than those of the formula III and the radicals $X^c$ are substituted by C$_1$–C$_6$alkyl in each of the two ortho-positions relative to both nitrogen atoms, the carbonyl groups in the radical of the formula III are in the 3,3',4,4'-position, $\overline{n}$ is an average value from 1.0 to 1.5 and $Z^a$ and, if appropriate, $Z^b$ are radicals of the formula IV or IX as defined above, especially radicals of the formula IX, in which $R^1$ is —CO—, —O— or —C(CF$_3$)$_2$—, and in which, in component B), $Z^d$ and, if appropriate, $Z^e$ are radicals of the formula IV or IV as defined above, in particular radicals of the formula IX, in which $R^1$ is —O— or —C(CF$_3$)$_2$—, $X^j$ is a divalent aromatic diamine radical which is substituted by C$_1$–C$_6$alkyl in at least one ortho-position, preferably in both ortho-positions, relative to both nitrogen atoms, at least 80 mol % of the radicals $X^j$ and, if appropriate, $X^k$ being identical to the radicals $X^a$ other than those of the formula III and, if appropriate, $X^b$.

Those compositions containing components A) and B) are very particularly preferred in which component A) consists of 100 mol % of recurring structural units of the formula I and component B) consists of 100 mol % of recurring structural units of the formula XXXI and $X^j$ is a divalent aromatic diamine radical which is substituted by C$_1$–C$_6$alkyl in both ortho-positions relative to each of the two nitrogen atoms.

Those compositions containing components A') and B) are also particularly preferred in which component A') consists of 10–60 mol % of recurring structural units of the formula XXVIII and of 90–40 mol % of recurring structural units of the formula XXIX, a 3,3',4,4'-thioxanthonetetracarboxylic acid radical being present in the formula XXVIII, $Z^d$ and $Z^e$ are radicals of 3,3'4,4'-benzophenonetetracarboxylic acid and $X^g$ and $X^h$ independently of one another are divalent aromatic diamine radicals which are substituted by C$_1$–C$_6$alkyl in at least one and preferably both ortho-positions relative to the two nitrogen atoms, at least 60 mol % of the radicals $X^j$ and, if appropriate, $X^k$ being identical to the radicals $X^g$ and $X^h$.

Those compositions of components A') and B) are very particularly preferred in which component B) consists of 100 mol % of recurring structural units of the formula XXXI and $X^g$ and $X^h$ independently of one another are divalent aromatic diamine radicals which are substituted by $C_1$–$C_6$alkyl in both ortho-positions relative to each of the two nitrogen atoms.

Preferably, the preferred embodiments with respect to compositions of A)/B) or A')/B) are polyimides with diamine radicals of the formulae XV to XVIII defined above.

Radiation-sensitive coatings of high photoactivity can be prepared from the copolyimides according to the invention or from the compositions of components A) and B) or A') and B).

The copolyimides and the mixtures are as a rule soluble in a large number of inert organic solvents of different polarity and are preferably employed in the form of their solutions.

Examples of suitable solvents are polar aprotic solvents which can be used by themselves or as mixtures of at least two solvents. Examples are: ethers, such as dibutyl ether, tetrahydrofuran, dioxane, ethylene glycol, dimethylethylene glycol, dimethyldiethylene glycol, diethyldiethylene glycol or dimethyltriethylene glycol, halogenated hydrocarbons such as methylene chloride, chloroform, 1,2-dichloroethane, 1,1,1-trichloroethane or 1,1,2,2-tetrachloroethane, carboxylic acid esters and lactones such as ethyl acetate, methyl propionate, ethyl benzoate, 2-methoxyethyl acetate, γ-methoxypropyl acetate, γ-butyrolactone, o-valerolactone and pivalolactone, carboxylic acid amides and lactams such as formamide, acetamide, N-methylformamide, N,N-dimethylformamide, N,N-diethylformamide, N,N-dimethylacetamide, N,N-diethylacetamide, γ-butyrolactam, ε-caprolactam, N-methyl-pyrrolidone, N-acetylpyrrolidone. N-methylcaprolactam, tetramethylurea or hexamethylphosphoric acid amide, sulfoxides such as dimethyl sulfoxide, sulfones such as dimethyl sulfone, diethyl sulfone, trimethylene sulfone or tetramethylene sulfone, and substituted benzenes such as chlorobenzene, o-dichlorobenzene, nitrobenzene, phenols or cresols.

Undissolved portions can be removed by filtration, preferably by pressure filtration. The polymer concentration in the coating agent thus obtained is preferably not more than 50% by weight, especially not more than 30% by weight and in particular not more than 20% by weight, relative to the solution.

In the preparation of the solutions, further conventional additives can be incorporated which do not adversely affect the light sensitivity. Examples of these are matting agents, flow agents, highly disperse fillers, flame-proofing agents, fluorescent brighteners, sensitizers, antioxidants, stabilizers, light stabilizers, dyes, pigments, adhesion promoters and antihalo dyes such as are described, for example, in U.S. Pat. No. 4,349,619.

The coating agent can be applied to suitable substrates or carrier materials by means of conventional methods, such as dipping, brushing and spraying processes or by whirler-coating, cascade-coating and curtain-coating. Examples of suitable substrates are plastics, metals and metal alloys, metalloids, semiconductors, glass, ceramics and other inorganic materials, for example $SiO_2$ and $Si_3N_4$.

The solvent is then removed, if necessary by heating and if necessary in vacuo. This gives tack-free, dry and uniform films. Depending on the use, the applied films can have layer thicknesses of up to 50 μm and more.

Protective films of polyimides or polyimide mixtures can be modified further by the action of radiation, whereby, for example, even further enhanced thermal stabilities are obtainable. It is also possible to use these polyimides or polyimide mixtures as a photographic recording material for relief images. The polymer layer of the material according to the invention has a light sensitivity which is high for this class of compounds, and it can be photocrosslinked directly. Due to the direct crosslinking under the action of radiation, additives such as sensitizers can be avoided, and the protective layers, images and films have excellent electrical properties. However, additional sensitisers can also be used. Moreover, the protective layers, images and films are distinguished by a high adhesive strength and thermal, mechanical and chemical resistance. During thermal aftertreatments, only slight shrinkage is observed, which has considerable advantages in use, because virtually no distortion of imaged structures is observed and/or because no internal strains are generated in coatings and films.

The material is stable on storage, but should advantageously be protected from the action of light.

Protective films or relief structures are as a rule produced by imagewise exposure through a photomask, subsequent development with a solvent or solvent mixture, the unexposed areas being removed, whereupon the image produced can, if desired, be stabilized by thermal aftertreatment.

The invention also relates to a process for producing protective films or relief structures, which comprise the steps of
i) coating a carrier material with a copolyimide or a polyimide mixture as defined above,
ii) irradiating the coated material with a pattern of actinic radiation, so that the irradiated areas of said polymer layer are crosslinked, and
iii) developing the system with a suitable developer.

Moreover, the invention also relates to the protective coatings and relief images obtained by radiation-crosslinking.

The photostructuring or photocrosslinking can be initiated by actinic radiation, for example by UV light, X-rays, laser light or electron beams, in particular by UV light of wavelengths 365 and 405 nm. Using the copolyimides or polyimide mixtures of this invention it is possible to produce highly resolved relief structures even on light-scattering or light-reflecting substrates such as ceramics or aluminium.

Examples of fields of application are protective, insulating and passivating coatings in electrical engineering and electronics, photomasks for electronics, textile printing and the graphic trade, etch resists for the production of printed circuits and printing plates and integrated circuits, relays for the production of X-ray masks, as a solder resist, as a dielectric for multilayer circuits and as a structural element for liquid crystal displays.

The invention also relates to the use of the copolyimides or polyimide compositions defined above for the production of insulating, passivating and protective layers and of relief images. For these applications, the layer thickness of the polymer layer is preferably 0.5 to 100 μm, especially 1 to 50 μm and in particular 1 to 10 μm.

The examples which follow illustrate the invention.

I. GENERAL EXPERIMENTAL CONDITIONS

The novel photosensitive polyimides or the components of the polyimide mixtures are produced and isolated by processes as described in EP-A-132,231 and EP-A-181,837.

Photosensitive layers of these novel polyimide systems are prepared by whirler-coating from a solution, ready-to-use solutions being obtained by dissolving the individual polyimides or the resin mixtures in 4-butyrolactone or N-methylpyrrolidone as the solvents to a total solids content of 5.0–15.0% and subjecting the solutions then to a pressure filtration through filters of 0.2–0.8 μm pore width.

For determining the photosensitivity, highly resolved relief structures of 1.00±0.05 μm layer thickness are produced on silicon wafers, an appropriate chromium mask having lines down to 1.0 μm being used, and different parts of a wafer also being exposed at different energies.

After development by spraying on a suitable developer solution, fine structures of an exposure range are obtained. The structure widths of the lines of 4 μm nominal width are determined optically, and the exposure energy required for the polyimide system is established by comparison with a standard system.

The exposure machine used is an MJB 55 mask-adjusting and -exposure machine made by Karl Suss, which emits power in the region of the lines at 365 nm, 405 nm and 436 nm. The wafers are exposed in vacuum contact.

Before each whirler-coating, the substrate is pretreated with a solution of 3-aminopropyltriethoxysilane as an adhesion promoter.

To assess the behaviour on highly reflective or light-scattering substrates, 2.0–10.0 μm thick layers are produced on ceramic substrates of 63×63 mm in size. An exposure series of fine structures is again produced, the assessment being carried out by inspection in a scanning electron microscope.

The spectral sensitivities are determined by filtering the light of the exposure apparatus through mercury line interference filters, monochromatic exposures thus being carried out with the individual emission lines of the mercury lamp spectrum. The radiation energies are here measured using an OAI power meter and the 400 or 365 nm probes, and the radiation output of the entire mercury lamp spectrum is related to the 400 nm probe.

The physical properties of the individual polymers are characterized by their glass transition temperature ($T_g$) and their inherent viscosities $\eta_{inh}$ (0.5%.by weight in NMP at 25° C.).

II. INDIVIDUAL EXAMPLES

EXAMPLE 1

A Photopolyimide 1, containing 90.9% of benzophenonetetracarboxylic dianhydride (BTDA) and 9.1 mol % of thioxanthonetetracarboxylic dianhydride, is prepared in accordance with the following formulation:

| | |
|---|---|
| Thioxanthonetetracarboxylic dianhydride (corresponding to EP-A-181,837, Example b) | 0.3523 g = 1 mmol |
| BTDA | 3.2211 g = 10 mmol |

-continued

| | |
|---|---|
| 1,4-Diamino-2,3,5,6-tetramethylbenzene | 0.9937 g = 6.05 mmol |
| 4,4'-Diamino-3,3'-dimethyl-5,5'-diethyl-diphenylmethane | 1.3973 g = 4.95 mmol |

The thioxanthonetetracarboxylic dianhydride is first allowed to react for 30 minutes at 0°–5° C. with the mixture of the diamines until a clear solution has formed, and the BTDA is then added. After the imidization, this gives a polyimide having the following physical data:

$\eta_{inh} = 0.88$ dl/g
$T_g = 369°$ C.

1 μm thick layers of this polymer on silicon wafers are obtained by whirler-coating (after applying 3-aminopropyltriethoxysilane as an adhesion promoter) for 25 seconds at 3,700 rpm with a filtered 9.0% solution in 4-butyrolactone, and then drying the layers for 30 minutes at 80° C. on a hot plate.

For developing highly resolved fine structures after exposure through a chromium mask, cyclopentanone is sprayed on for 31 seconds, followed by a 5 second rinsing cycle with xylene.

In this case, an illumination energy of 165 mJ/cm² is necessary to produce good structures, if the full line spectrum of the exposure machine (365 nm + 405 nm + 436 nm) is used for the exposure.

If the emission line at 405 nm is filtered out, the required exposure energy is 173 mJ/cm², measured monochromatically.

Highly resolved relief structures on a strongly reflecting and light-scattering substrate are obtained, when the 9% solution of the polymer 1 is whirler-coated for 25 seconds at 1,350 rpm onto ceramic substrates, and the coating is dried for 30 minutes at 80° C. and then exposed through a test mask with the USAF 1951 pattern (isolated lines).

When exposing with a total energy (all the spectral lines of the exposure machine) of 141 mJ/cm² and then developing for 50 seconds by spraying on cyclopentanone in a spray developer, highly resolved relief structures are obtained in spite of a rough surface topology, even the 7.4 structure element (2.8 μm wide isolated lines) of the 2.5 μm thick image elements obtained being still resolved.

EXAMPLE 2

(Polyimide mixture) A polymer 2, prepared according to

| | |
|---|---|
| EP-A-132,221 from benzophenonetetracarboxylic dianhydride | 100 mol % |
| 1,4-diamino-2,3,5,6-tetramethylbenzene | 55 mol % and |
| 4,4'-diamino-3,3'-dimethyl-5,5'-diethyl-diphenylmethane | 45 mol %, | is processed together with polymer 1 in the following manner to give a polyimide blend.

| | |
|---|---|
| Polyimide 1: | 0.175 g (30% by weight) $\eta_{inh}$ = 0.88 dl/g; |
| Polyimide 2: | 0.408 g (70% by weight) $\eta_{inh}$ = 0.97 dl/g; |
| 4-Butyrolactone: | 6.276 g. |

The silicon wafer is whirler-coated with the overall 8.5% solution at 3,800 rpm (20 seconds), layers of 1.0 μm thickness being produced.

An illumination energy of 327.5 mJ/cm$^2$ is necessary to produce good fine structures of 4 μm width, development being carried out with cyclopentanone for 24 seconds. In the scanning electron microscope, the structures show a homogeneous nature of the material.

EXAMPLES 3-13

The chemical compositions of the polymers used in Examples 3-13 and their physical data can be seen in Table 1. The polymers are prepared according to EP-A-132,221, EP-A-181,837 and Example 1.

The properties, process data and photosensitivities of the photopolyimides or polyimide mixtures from Examples 3-13 can be seen in Table 2, together with the data for Examples 1-2.

TABLE 1

Polyimides and polyimide mixture components

| Polymer No. | Dianhydride 1 (mol %) | Dianhydride 2 (mol %) | Diamine 1 (mol %) | Diamine 2 | $\eta_{inh}$ (dl/g) | $T_g$ (°C.) | soluble in 1) |
|---|---|---|---|---|---|---|---|
| 3 | O=C with S-bridged diphenyl (10) | benzene dianhydride (90) | 3,3'-CH₃, 5,5'-C₂H₅ diphenylmethane (100) | — | 1.23 | 413 | NMP |
| 4 | — | benzene dianhydride (100) | 3,3'-CH₃, 5,5'-C₂H₅ diphenylmethane (100) | — | 0.89 | 390 | NMP |
| 5 | O=C with S-bridged diphenyl (10) | hexafluoroisopropylidene diphthalic (90) | 3,3'-CH₃, 5,5'-C₂H₅ diphenylmethane (45) | tetramethylbenzene (55) | 1.05 | 376 | GBL |
| 6 | O=C with S-bridged diphenyl (10) | hexafluoroisopropylidene diphthalic (90) | — | tetramethylbenzene (100) | 0.94 | 448 | GBL |

TABLE 1-continued

Polyimides and polyimide mixture components

| Polymer No. | Dianhydride 1 (mol %) | Dianhydride 2 (mol %) | Diamine 1 (mol %) | Diamine 2 | η_inh (dl/g) | T_R (°C.) | soluble in |
|---|---|---|---|---|---|---|---|
| 7 | [benzophenone-thio dianhydride] (100) | — | [bis(methyl-ethylphenyl)methane] (70) | [methyl-diethylbenzene] (30) | 0.79 | 403 | NMP |
| 8 | — | [oxydiphthalic dianhydride] (100) | [bis(methyl-ethylphenyl)methane] (100) | — | 1.10 | 290 | NMP |
| 9 | [benzophenone-thio dianhydride] (10) | [oxydiphthalic dianhydride] (90) | [bis(methyl-ethylphenyl)methane] (100) | — | 1.13 | 304 | GBL |
| 10 | [benzophenone-thio dianhydride] (30) | [oxydiphthalic dianhydride] (70) | [bis(methyl-ethylphenyl)methane] (100) | — | 0.83 | 350 | GBL |

TABLE 1-continued
Polyimides and polyimide mixture components
| Polymer No. | Dianhydride 1 (mol %) | Dianhydride 2 (mol %) | Diamine 1 (mol %) | Diamine 2 | η_inh (dl/g) | T_g (°C.) | soluble in 1) |
|---|---|---|---|---|---|---|---|
| 11 | 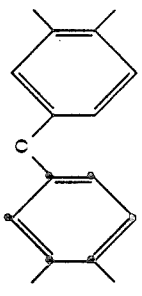 (10) | 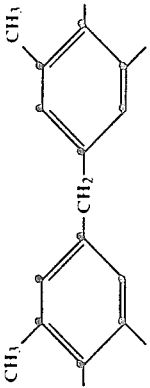 (90) | 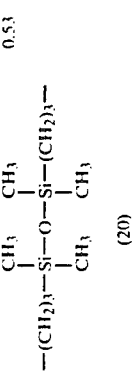 (80) | 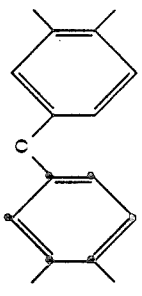 (20) | 0.53 | 232 | GBL |
| 12 | — | 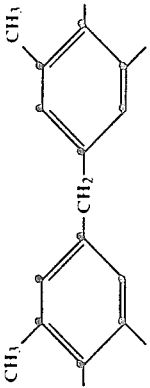 (100) | 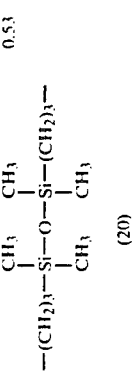 (85) | 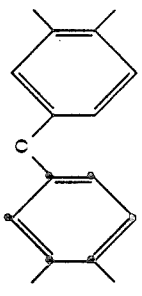 | 1.12 | 316 | GBL |
| 13 | 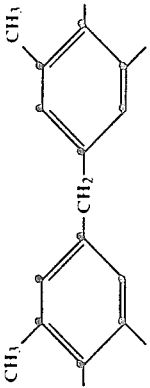 (50) | 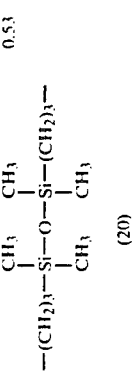 (50) | 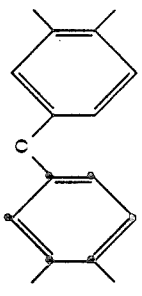 (85) | 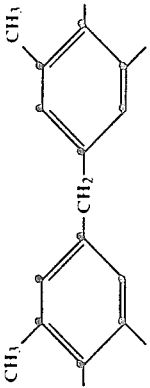 | 1.35 | 406 | GBL |
| 14 | 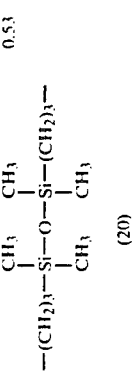 (10) | (90) | (100) | — | 0.59 | 286 | GBL |
1) NMP: N-Methylpyrrolidone
GBL: 4-Butyrolactone

TABLE 2
Summary of Examples 1-13

| Example No. | Polyimide A or A' (% by wt.) | Mixture Component B (% by wt.) | Solvent 1) | Total solids content (% by wt.) | Developer 2) composition solv. 1 | solv. 2 | Developing time (sec) | Illumination energy 3) (mJ/cm$^2$) |
|---|---|---|---|---|---|---|---|---|
| 1 | 1 (100) | — | GBL | 9.0 | Cyclopentanone | — | 21 | 165 |
| 2 | 1 (30) | 2 (70) | GBL | 8.5 | Cyclopentanone | — | 24 | 327.5 |
| 3 | 3 (100) | — | NMP | 5.5 | NMP (1): | Ethanol (0.50) | 18 | 210 |
| 4 | 3 (50) | 4 (50) | NMP | 6.0 | NMP (1): | Ethanol (0.50) | 15 | 818 |
| 5 | 5 (100) | — | GBL | 7.5 | Cyclopentanone (1): | Xylene (1.30) | 20 | 68.8 |
| 6 | 6 (100) | — | GBL | 7.5 | Cyclopentanone | — | 20 | 109.5 |
| 7 | 7 (10) | 2 (90) | NMP | 8.5 | NMP (1): | Xylene (1.25) | 25 | 317 |
| 8 | 9 (100) | — | GBL | 8.2 | GBL(1): | Xylene (1.50) | 18 | 35 |
| 9 | 10 (100) | — | GBL | 10.0 | GBL(1): | Xylene (1.50) | 18 | 66 |
| 10 | 10 (33.4) | 8(66.6) | NMP | 8.0 | NMP(1): | Xylene (1.60) | 10 | 51 |
| 11 | 11 (100) | — | GBL | 11.0 | Cyclopentanone | | 40 | 773 |
| 12 | 13 (12.5) | 12(87.5) | NMP | 7.0 | NMP(1): | Ethanol (0.32) | 60 | 129 |
| 13 | 14 (100) | — | GBL | 9.9 | Propylenecarbonate (1): | Ethanol (0.67) | 8 | 450 |

1) see Table 1
2) Parts by weight
3) Complete spectrum (365, 405 and 436 nm, 400 nm probe)

What is claimed is:

1. A composition comprising:

(A) a copolyimide or a mixture of copolyimides consisting of 100–70 mol % of recurring structural units of the formula I and 0–30 mol % of recurring structural units of the formula II

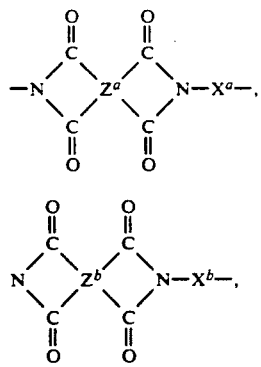

in which $Z^a$ is a tetravalent aromatic tetracarboxylic acid radical other than that of thioxanthonetetracarboxylic acid, the carboxyl groups thereof in each case being located in pairs in the ortho-position or peri-position relative to one another, and $X^a$ is a divalent aromatic diamine radical which, in at least one ortho-position relative to at least one nitrogen atom, carries a hydrocarbon substituent having at least one aliphatic α-hydrogen atom or $X^a$ is a radical of the formula III

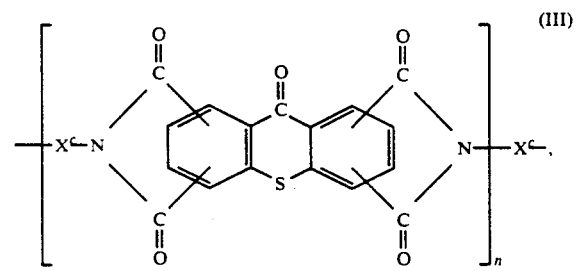

in which $X^c$ is a divalent aromatic diamine radical which, in ortho-position relative to the two nitrogen atoms, carries in each case at least one monovalent hydrocarbon substitutent having at least one aliphatic α-hydrogen atom, and $\bar{n}$ assumes an average value of 1.0 to 2.5, $Z^b$ is as defined for $Z^a$ and $X^b$ is an aliphatic, cycloaliphatic, aromatic or araliphatic diamine radical, excluding a radical of the formula III, the total quantity of thioxanthone radicals in component A), relative to the total quantity of all tetracarboxylic acid radicals in this component, being 2.0 to 40 mol %, and B) a polyimide or a mixture of polyimides consisting of 100–80 mol % of recurring structural units of the formula XXXI and of 0–20 mol % of recurring structural units of the formula XXXII

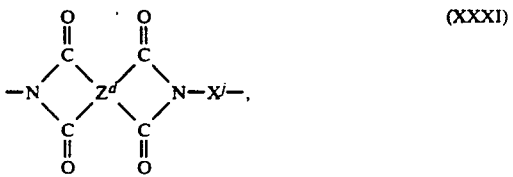

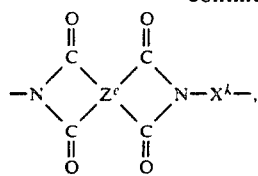
(XXXII)

in which $Z^d$ and $Z^e$ independently of one another can assume one of the meanings defined for $Z^a$, $X^j$ can assume one of the meanings defined for $X^a$ with the exception of the formula III and $X^k$ can assume one of the meanings defined for $X^b$, it being necessary in the case of the A)/B) mixtures that at least 70 mol % of the radicals $Z^d$ and, if appropriate, $Z^e$ in component B), relative to the total quantity of these radicals, are identical to the radicals $Z^a$ and, if appropriate, $Z^b$ in component A) and at least 70 mol % of the radicals $X^j$ and, if appropriate, $X^k$ in component B), relative to the total quantity of these radicals are identical to the radicals $X^a$ other than those of the formula III and, if appropriate, to the radicals $X^b$ in component A), or it being necessary that at least 40 mol % of the radicals $X^j$ and, if appropriate, $X^k$ in component B), relative to the total quantity of these radicals, are identical to the radicals $X^g$, and that in all combinations A)/B), the quantity of the component A) is selected such that the quantity of thioxanthonetetracarboxylic acid radicals, relative to the total quantity of the tetracarboxylic acid radicals in the polyimide mixture, is between 5.0 and 30 mol %.

2. A composition according to claim 1, wherein the quantity of thioxanthonetetracarboxylic acid radicals, relative to the total quantity of the tetracarboxylic acid radicals in the polyimide mixture, is between 5.0 and 20 mol %.

3. A composition containing components A) and B) according to claim 1, wherein, in component A), the radicals $X^a$ other than those of the formula III and the radicals $X^c$ are substituted by $C_1$-$C_6$alkyl in each of the two ortho-positions relative to both nitrogen atoms, the carbonyl groups in the radical of the formula III are in the 3,3',4,4'-position $\bar{n}$ is an average value from 1.0 to 1.5 and $Z^a$ and, if appropriate, $Z^b$ are radicals of the formula IV or IX

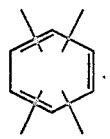
(IV)

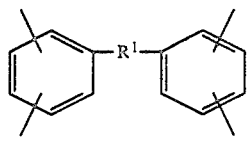
(IX)

in which the free bonds are in each case located in pairs in the ortho-position relative to one another, $R^1$ is a group of the formulae —S—, —SO$_2$—, —NR$^2$—, —SiR$^3$R$^4$—, SiR$^3$R$^4$—O—SiR$^3$R$^4$—, —O—R$^5$—SiR$^3$R$^5$—O—, —CO—, —O—, —CH$_2$—, —C(CH$_3$)$_2$— or —C(CF$_3$)$_2$—, $R^2$ is hydrogen or $C_1$-$C_6$alkly, $R^3$ and $R^4$ independently of one another and $C_1$-$C_6$alkyl, $C_1$-$C_6$perfluoroalkyl, $C_1$-$C_6$alkoxy or $C_1$-$C_6$perfluoroalkoxy and $R^5$ is alkylene, and wherein, in component B), $Z^d$ and, if appropriate, $Z^e$ are radicals of the formula IV or IX, and $X^j$ is a divalent aromatic diamine radical which is substituted by $C_1$-$C_6$alkyl in at least one orthoposition relative to both nitrogen atoms, at least 80 mol % of the radicals $Z^d$ and $Z^e$ being identical to the radicals $Z^a$ and $Z^b$, and at least 80 mol % of the radicals $X^j$ and, if appropriate, $X^k$ being identical to the radicals $X^a$ other than those of the formula III and, if appropriate, to the radicals $X^b$.

4. A composition according to claim 3, wherein $Z^a$ and, if appropriate, $Z^b$ are radicals of the formula IX in which $R^1$ is —CO—, —O— or —C(CF$_3$)$_2$— and wherein $Z^d$ and, if appropriate, $Z^e$ are radicals of the formula IX, in which $R^1$ is —O— or —C(CF$_3$)$_2$—.

5. A composition according to claim 1, wherein component A) consists of 100 mol % of recurring structural units of the formula I and the component B) consists of 100 mol % of recurring structural units of the formula XXXI and $X^j$ is a divalent aromatic diamine radical which is substituted by $C_1$-$C_6$-alkyl in both ortho-positions relative to each of the two nitrogen atoms.

* * * * *